United States Patent [19]

Yoshimura et al.

[11] Patent Number: 4,977,435
[45] Date of Patent: Dec. 11, 1990

[54] SEMICONDUCTOR DEVICE WITH A SPLIT CONDUCTION CHANNEL

[75] Inventors: Toshiyuki Yoshimura, Kokubunji; Eiji Takeda, Koganei; Hideyuki Matsuoka, Kokubunji; Yasuo Igura, Kawasak, all of Japan

[73] Assignee: Hitachi, Ltd., Tokyo, Japan

[21] Appl. No.: 264,785

[22] Filed: Oct. 31, 1988

[30] Foreign Application Priority Data

| Oct. 30, 1987 | [JP] | Japan | 62-272944 |
| Dec. 25, 1987 | [JP] | Japan | 62-327134 |
| Dec. 28, 1987 | [JP] | Japan | 62-329875 |
| Jul. 11, 1988 | [JP] | Japan | 63-170957 |

[51] Int. Cl.$^5$ .................. H01L 29/68; H01L 29/78; H01L 29/161; H01L 25/04
[52] U.S. Cl. .................. 357/23.5; 357/23.14; 357/23.2; 357/16; 357/83; 357/53
[58] Field of Search ............ 357/16, 23.1, 23.2, 357/83, 23.5, 23.14

[56] References Cited

U.S. PATENT DOCUMENTS 4,550,330 10/1985 Fowler ........................ 357/16

FOREIGN PATENT DOCUMENTS 242652 10/1987 European Pat. Off.
159769 7/1986 Japan.

OTHER PUBLICATIONS

Bandyopadhyay et al. "A Novel Quantum Interference Transistor (QUIT) with Extremely Low Power-Delay Product and Very High Transconductance" IEDM 86 pp. 76–79.
Imry et al. "Quantum Interference and the Aharonov–Bohm Effect" Scientific American, Apr. 1989, pp. 56–62.
Datta et al. "Novel Interference Effects between Parallel Quantum Wells", Physical Review Letters, vol. 55, No. 21, Nov. 18, 1985, pp. 2344–2347.
Bandyopadhyay et al., "Aharonov-Bohm Effect in Semiconductor Micro-Structures: Novel Device Possibilities", Superlattices and Microstructures, vol. 2, No. 6; 1986, pp. 539–542.

Primary Examiner—William Mintel
Assistant Examiner—Robert P. Limanek
Attorney, Agent, or Firm—Antonelli, Terry, Stout & Kraus

[57] ABSTRACT

A semiconductor field effect transistor is provided which permits controlling of the phase of carriers between a source region and a drain region formed in a first semiconductor layer. Such control can be used to modulate characteristics such as the electric conductivity and drain current of the transistor. To accomplish this control, a gate electrode is formed over a portion of said first semiconductor layer between the source and drain regions. The gate electrode splits to form first and second branches at a first location adjacent to the source region. These first and second branches subsequently rejoin one another at a second location adjacent to said drain region. When a potential is applied to the gate electrode, it will produce first and second two-dimensional carriers conduction paths at a surface of the portion of the first semiconductor layer under the first and second branches. An arrangement is provided for modifying the phase of carriers passing through the first conduction path relative to the phase of carriers passing through the second conduction path to produce a phase difference for carriers received at the drain region through said first and second conduction paths.

29 Claims, 6 Drawing Sheets

SEMICONDUCTOR DEVICE WITH A SPLIT CONDUCTION CHANNEL

BACKGROUND OF THE INVENTION

The present invention relates to a semiconductor device utilizing two-dimensional carriers, such as a heterojunction device or an MOS device, and, more particularly, to a field effect transistor which is formed under a gate electrode and which controls a current flowing through a split conduction channel which branches and then joins again.

Prior art field effect transistors having a heterojunction arrangement (e.g , HEMT: High Electron Mobility Transistor), are typically so designed that the density of electrons in an electron accumulation layer generated in the vicinity of the interface of the heterojunction which is formed by joining two kinds of semiconductors having different electron affinity from each other is varied by a voltage impressed on a gate electrode so as to control the electrical conductivity between two other electrodes, i.e., source and drain electrodes, as described in the Official Gazette on Japanese Patent Publication No. 53714/1984.

The above-described prior art is aimed at significantly improving electron mobility by a method wherein a semiconductor layer operating as a source of supply of electrons contributing to the electrical conductivity is separated from a semiconductor layer operating as a conduction channel by using different semiconductor layers. Concretely, an n-type AlGaAs (e.g., $Al_{0.3}Ga_{0.7}As$) layer doped with Si is used as the source of supply of electrons, while a non-doped or low-concentration n-type GaAs layer is used as the conduction channel so as to reduce electron dispersion.

As semiconductor elements have become more minute, it has become necessary to take the information regarding the phase of the carrier into consideration. In a field effect transistor having a size of about 0.1 $\mu$m and having a construction wherein a current channel branches at one point and then joins again at another point, interference will occur due to the difference in phase between two electron waves at the joining point. There is no description, in the above-stated prior art, regarding the information on the phases of such electron waves.

A semiconductor device wherein the phase information on the electron waves is controlled by a magnetic field, on the other hand, is discussed in the Physical Review Letters, Vol. 55 (1985), pp. 2344-2347. According to the teachings of this article, the current channel is divided in two by making two heterojunctions close to each other, with a magnetic field being impressed in a direction vertical to a plane containing the current channel divided in two, so as to vary the phases of electron waves passing through the two parts of the current channel to thereby control the amplitude of a current value. This is based on the Aharonov-Bohm effect, as described in the article.

This technique presents a semiconductor element utilizing the phase information on the electron waves, suggesting a direction of future advance for minute elements However, the arrangement described in this article has problems in terms of simplicity and practicability since a magnetic field is used for controlling the phases of the electron waves Generally, control of such a magnetic field is difficult to implement. Also, the two paths shown in the article are formed vertically in a substrate, with a separation layer required at a branching portion of the paths, and this is difficult to implement from a manufacturing standpoint.

On the other hand, an arrangement using an electrostatic field to implement the Aharonov-Bohm effect in a semiconductor device has been described in articles by Bandyopadhyay et al in Superlattices and Microstructures, Vol. 2, No. 6, 1986 and in IEDM 86, pp. 76-79. In the Superlattices and Microstructures article, a generic ring structure for conducting electrodes, which is similar to FIG. 2 of the present specification is described by way of theoretical background However, because of practical difficulties in using such a theoretical conductor, both Bandyopadhyay et al articles describe an arrangement wherein a gate is used to apply an electrostatic field on two upper and lower conduction paths of GaAs which are separated from one another by an AlGaAs layer at a point where the two conduction paths pass under the gate. Because the upper path is closer to the gate, it will be subject to a stronger field from the gate. Therefore, a phase difference will exist between electrons travelling through the two paths at the point where the paths rejoin By virtue of this arrangement, Bandyopadhyay et al can modulate the drain current of the device based on the potential applied to the gate.

Although this electrostatic control arrangement in the Bandyopadhyay et al device is easier to control than the previously described magnetic arrangement, the implementation of the device is difficult because of the need to manufacture upper and lower channels separated from one another at a location under the gate. This requires a large number of difficult manufacturing steps, which make the device undesirable from a viewpoint of practical implementation.

SUMMARY OF THE INVENTION

Accordingly, it is an object of the present invention to provide a semiconductor element which enables electric control of the phase of carriers in the semiconductor device having the heterojunction or MOS structure.

It is a further object of the present invention to provide such a semiconductor element that is easy to manufacture.

It is a still further object to provide such a semiconductor element wherein the carrier conduction paths are two-dimensional at a predetermined interface to provide easy controllability.

The above-stated objects are attained by providing at least one control electrode controlling the phase of the aforesaid carriers, in addition to a gate electrode having a shape such that it branches in two at one point and then joins again. This combination of a control electrode and a gate electrode can be implemented with a semiconductor device utilizing two-dimensional carriers such as one having a heterojunction or in one having an MOS structure. A voltage impressed on the control electrode is adjusted to make the potential energy different in each channel lying between a branching point and a joining point of a carrier accumulation layer formed in the same shape with that of the gate electrode. The direction of an electric field impressed by the aforesaid control electrode is not parallel to but different from the direction of an electric field impressed by the aforesaid gate electrode. The shape of the gate electrode can be a circular shape, as well as rectangular, triangular or any other shape wherein the channel branches and then joins again. Also, embodiments are provided wherein means other than a separate control electrode are used to produce the desired phase difference.

BRIEF DESCRIPTION OF THE DRAWINGS

FIG. 11 is a top view of a modification of the gate structure which can be used with any of the above-listed embodiments, while

FIGS. 13 (a) and 13(b) show examples of alternate gate electrode arrangements

DETAILED DESCRIPTION

Figure 2:
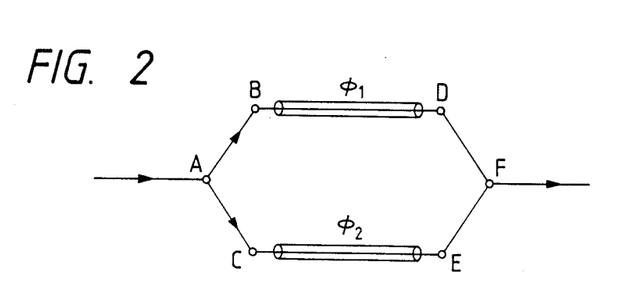
FIG. 2 is an illustration of the Aharonov-Bohm effect used in the present invention.

The principle and operation of the present invention will first be described from a theoretical viewpoint by using FIG. 2 which is an illustration of the electrostatic Aharonov-Bohm effect. This figure shows channels of electron beams in a vacuum. In the vacuum, an electron beam branches in two at a point A, passes through metal tubes given different potential energies, respectively, and laid between B and D and C and E, and joins again at a point F. When the potential energies between B and D and C and E are denoted by $\phi_1$ and $\phi_2$, respectively, the length of segments BD and CE by l, the speed of electrons in the directions BD and CE thereof by v, the elementary charge of the electrons by e, and Planck's constant by h, the following different $\Delta S$ occurs between the respective phases of electron waves at the point F:

$$\Delta S = \frac{2\pi e l}{h v} (\phi_1 - \phi_2)$$

In this equation, the potential energies $\phi_1$ and $\phi_2$ are assumed to be not so large as to vary the speed v of the electrons.

Figure 1A:
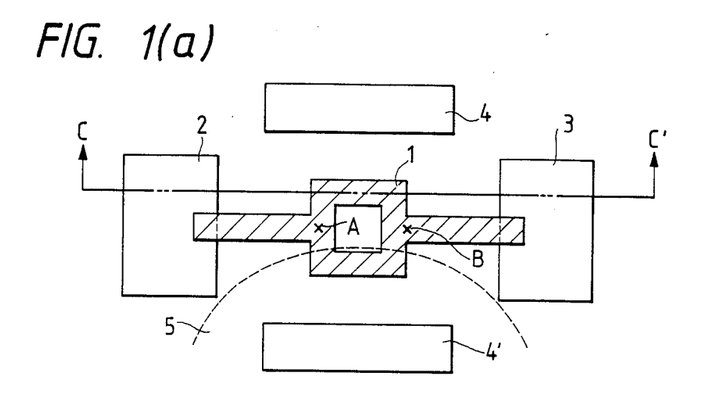
FIG. 1(a) is a plan view of a semiconductor device of a first embodiment of the present invention.
Figure 1B:
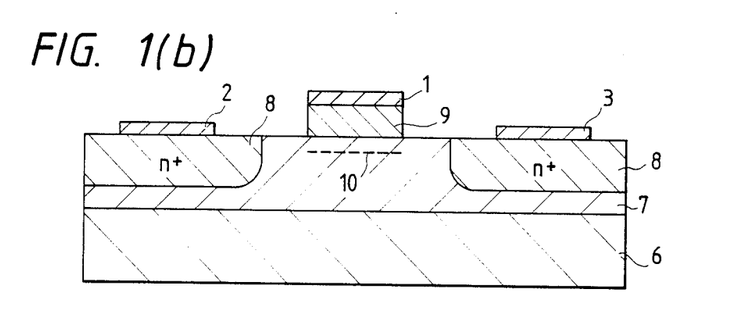
FIG. 1(b) is a view of a section taken along a line C—C' of the semiconductor device of FIG. 1(a)

The above-described idea, which is set forth in regard to a phenomenon which occurs in a vacuum, is also applicable to semiconductor elements. This will be described, subsequently, by using FIGS. 1(a) and 1(b). FIG. 1(a) is a plan view showing a typical example of a structure of the present invention, and FIG. 1(b) shows a section taken along a line C—C' of FIG. 1(a). Of course, the structure shown herein is merely one example, which is cited for explaining the principle and operation of the present invention.

In FIG. 1(a), numeral 1 denotes a gate electrode comprising an annular shape which branches and joins, numeral 2 a source electrode, numeral 3 a drain electrode, numerals 4 and 4' a set of control electrodes according to the present invention which are provided separately from the gate electrode 1, and numeral 5 a depletion layer which expands under the control electrodes. It is to be noted that throughout this description and in the claims, the term "source" is intended to mean a region where carriers are supplied to the conduction channel and the term "drain" is intended to mean a region where carriers from the source arrive, regardless of whether the carriers are holes or electrons.

In FIG. 1(b), numeral 6 denotes a semi-insulative GaAs substrate, numeral 7 a non-doped or low-concentration p-type GaAs layer grown epitaxially on the semi-insulative GaAs substrate 6, numeral 8 a high-concentration n+ type layer formed in the non-doped or low-concentration p-type GaAs layer 7, numeral 9 an n-type $Al_{0.3}Ga_{0.7}As$ layer grown epitaxially on a part of the non-doped or low-concentration p-type GaAs layer 7, and numeral 10 an electron accumulation layer formed under the gate electrode 1. As examples of the potential of each electrode, the source electrode 2 can be grounded, the drain electrode 3 can be positive, the gate electrode 1 can be negative or positive, the control electrode 4 can be grounded, and the control electrode 4' can be positive. Of course, these potentials and conductivity types are given for purposes of example only, and the invention is not limited to this.

Figure 3:
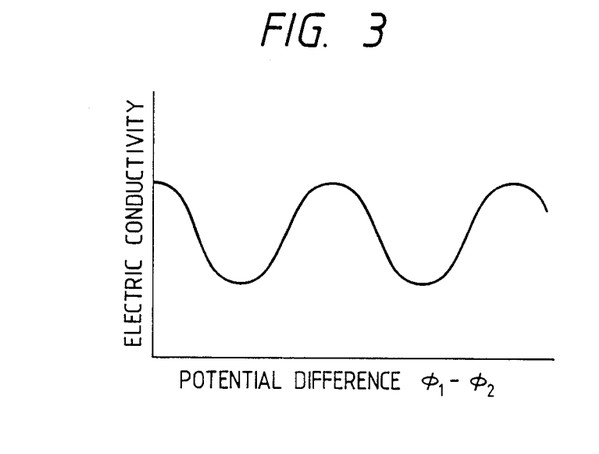
FIG. 3 shows modulation of electric conductivity obtained with the present invention.

In this structure, the electron accumulation layer 10 is formed under the gate electrode 1 by impressing an appropriate voltage on the gate electrode 1, and thereby a conduction channel is formed between the source electrode 2 and the drain electrode 3. Electrons flowing out of the source electrode 2 branch at a point A and join again at a point B. By impressing an appropriate voltage on the control electrodes 4 and 4', the depletion layer 5 can be expanded, as shown in FIG. 1(a), so that it covers only one of the branching conduction channels. In other words, it becomes possible to make the potential energies of the branching conduction channels different from each other. As a result, the electrons flowing out of the source electrode 2, branching at the point A and passing through each branching conduction channel pass through different potential energies and then join at the point B. Therefore, the electrons are essentially equivalent to those discussed with regard to the illustration of FIG. 2. The difference $\Delta S$ between the phases of the electrons passing through the separate branching conduction channels is varied by changing a voltage impressed on the control electrodes 4 and 4'. The difference $\Delta S$ causes the interference of electron waves, and oscillation occurs in the probability of existence of the electron waves at the point B in a cycle of:

$$\phi_1 - \phi_2 = \frac{hv}{el}$$

as a function of the difference between the potential energies. This brings about an oscillation as shown in FIG. 3 also in the electric conductivity between the source electrode 2 and the drain electrode 3.

A significant advantage of the present invention over an arrangement such as described in the Bandyopadhyay et al articles is that it can readily be manufactured using well-known semiconductor manufacturing techniques.

Regarding this, a description will now be provided regarding a manufacturing process of the device of the present embodiment by using FIG. 1(b).

First, the non-doped or low-concentration p-type GaAs layer 7 is grown about 2000 Å thick on the semi-insulative GaAs substrate 6 by using a molecular beam epitaxial growth method. A lower impurity concentration is preferable, and the layer is a non-doped or low-concentration p-type one.

Next, the n-type $Al_{0.3}Ga_{0.7}As$ layer 9 is grown about 1000 Å thick on the GaAs layer 7 by using the molecular beam epitaxial growth method again. Si is used as an impurity, and the concentration thereof is about $4 \times 10^{17}$ $1/cm^3$.

Next, PMMA, which is a positive-type electron beam resist, is applied, and patterning is made by electron beam lithography. Thereafter, a gate pattern part is opened by development for which a developer for exclusive use is used. After Al is evaporated on the whole surface, the immersion in the developer is conducted again, and the gate electrode 1 is formed by a lift-off method. With the gate electrode 1 used as a mask, subsequently, an unnecessary part in the $Al_{0.3}Ga_{0.7}As$ layer 9 is removed by dry etching or wet etching.

Subsequently, after the positive-type electron beam resist PMMA and the electron beam lithography are applied again, an opening is made for forming the high-concentration n+ type layer 8 in the regions under the control electrodes 4 and 4', by the development using a developer for exclusive use. Thereafter, the high-concentration n+ type layer is formed by an ion implantation method and subsequent annealing or the like. Si or Se can be used as an n-type impurity. Herein, ions are implanted in a region under the source electrode 2, in a region under the drain electrode 3 and in the regions under the control electrodes 4 and 4' in FIG. 1(a).

Then, the source electrode 2, the drain electrode 3 and the control electrodes 4 and 4', each of which preferably have a double-layer structure of a gold-germanium alloy/gold, are formed by using an evaporation method.

The size of the outside diameter of the annular shape of the gate electrode 1 is about 0.3 μm or below, and the line width thereof is about 0.1 μm or below.

Figure 4:
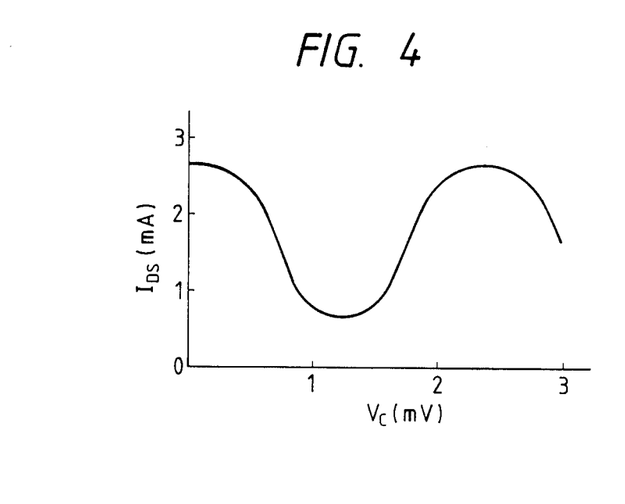
FIG. 4 shows modulation of current which is obtained with the present invention.

Next, a description will be provided regarding the characteristics of an element manufactured as stated above. In FIG. 4, the axis of the abscissa shows a voltage $V_C$ impressed on the control electrode 4' (presuming that the control electrode 4 is grounded), and the axis of the ordinate shows a current $I_{DS}$ flowing between the source electrode 2 and the drain electrode 3. The gate voltage impressed on the gate electrode 1 is $V_G = +0.5$ V, while the voltage between the source electrode 2 and the drain electrode 3 is $V_{DS} = 1$ mV.

Preferably, the entire device is cooled herein down to the temperature of liquid nitrogen (77 K.). Although the effect of the present invention is also produced without such cooling of the device, the cooling brings about a reduction in the effect of dispersion of electrons, and consequently the electric conductivity is increased and the degree of variation in the conductivity is made high, thus producing an effect that an amplification factor can be improved.

Accordingly, as is apparent from FIG. 4, periodic modulation occurs in the current $I_{DS}$ due to the voltage impressed on the control electrodes 4 and 4'.

Figure 5:
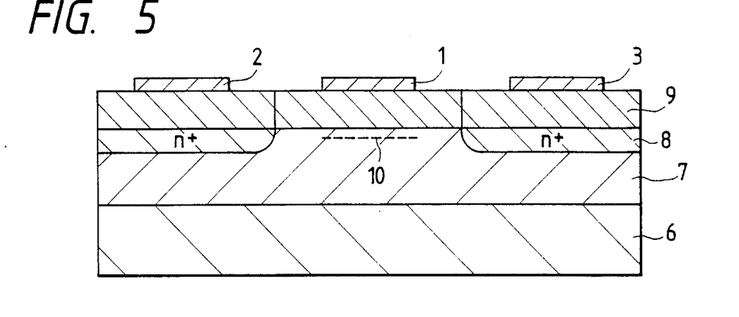
FIG. 5 is a sectional view of a second embodiment of the present invention.

FIG. 5 is a sectional view of a semiconductor device of a second embodiment of the present invention. In this second embodiment, the same process is used as in the embodiment 1 until the point where the gate electrode 1 is formed by the lift-off method. Specifically, the etching of the $Al_{0.3}Ga_{0.7}As$ layer 9, which is conducted in the embodiment 1, is not conducted in the second embodiment. Other than this, both the process and the structure are the same as those in the case of embodiment 1. Accordingly, the phenomenon of modulation in FIG. 4 will also be in a planar-type element manufactured in accordance with the second embodiment.

Figure 6:
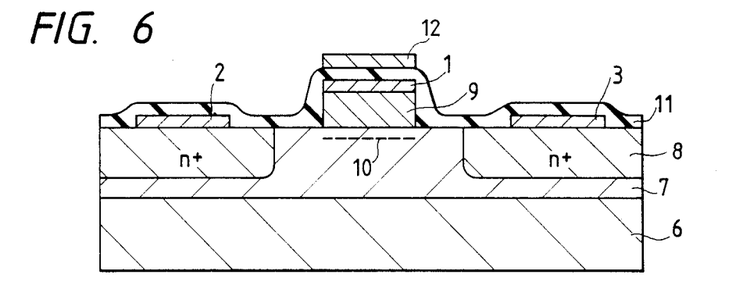
FIG. 6 is a sectional view of a third embodiment of the present invention.

FIG. 6 is a sectional view of a semiconductor device of a third embodiment of the present invention. In the third embodiment, a second gate electrode 12 shaped as a rectangle (whose dimensions are the same herein with the contours of the annular shape of the gate electrode 1) is formed on the gate electrode 1 with an insulating film 11 interlaid, by using the technique of electrode beam lithography, as shown in the figure, after the high-concentration n+ type layer 8 in the embodiment 1 is formed. This gate electrode 12 is formed so as to control the inversion of the central part surrounded by the annular shape of the gate electrode 1. The process other than the above-mentioned change is the same as in the first embodiment. Thus, the phenomenon of modulation shown in FIG. 4 will also be found in an element manufactured in accordance with FIG. 6.

Figure 7:
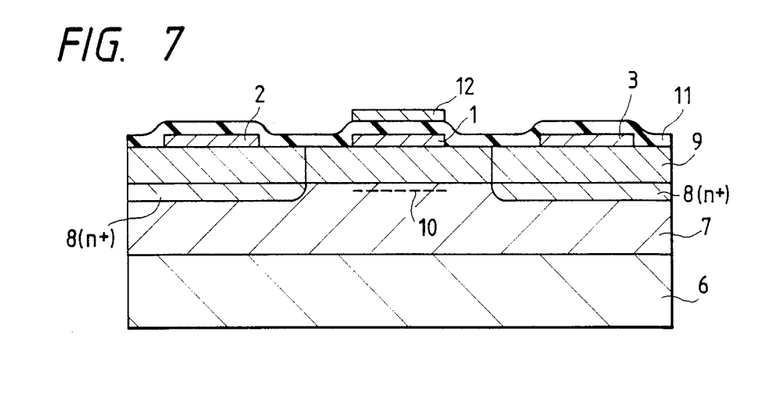
FIG. 7 is a sectional view of a fourth embodiment of the present invention.

FIG. 7 is a sectional view of a semiconductor device of a fourth embodiment of the present invention. After the high-concentration n+ type layer 8 in the second embodiment is formed, a second gate electrode 12 shaped as a rectangle is formed on the gate electrode 1 with an insulating film 11 interlaid, by using the technique of electron beam lithography, as shown in the figure. This electrode 12 is formed so as to prevent the inversion of the central part surrounded by the gate electrode 1, similar to the third embodiment. The process other than the above-mentioned change is the same as in the second embodiment Thus, the phenomenon of modulation shown in FIG. 4 can also be found in an element manufactured in this way.

In the above-described devices of the first four embodiments, the expansion of the depletion layer from the control electrode is controlled by impressing a reverse bias on the p-n junction. However, it should be noted that the depletion layers can also be controlled by a Schottky barrier. Thus, control electrodes 4 and 4' of aluminum can be formed by using an evaporation method without the formation of the n+ type layer in the regions of the control electrodes 4 and 4' in the previously described first embodiment 1. The phenomenon of modulation shown in FIG. 4 can also be found in a planar-type element manufactured in this way.

Although the above-described embodiments are aimed to control the electron conduction, they are not limited thereto, but are also applicable, of course, to the control of hole conduction.

Also, although one set of two control electrodes 4 and 4' are provided in each of the above-described embodiments, a single electrode can be used to cause different potential energies at the branching and joining points of the electron accumulation layer by adjusting the voltage of such a single control electrode. In other words, the number of the control electrodes is not limited to that in the above-described embodiments, but may also be in one, two or more.

Figure 13A:
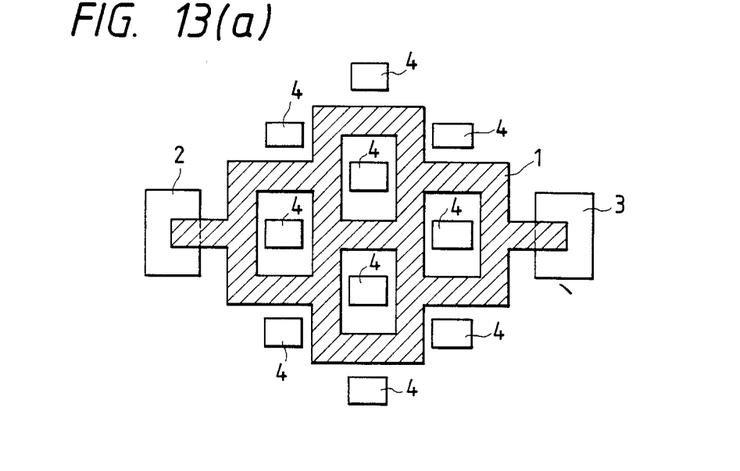
Figure 13B:
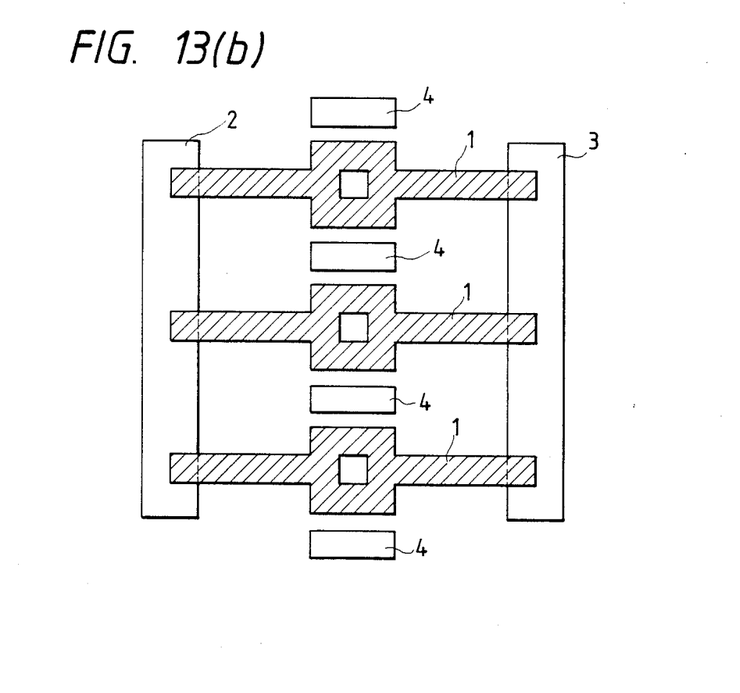

Of course, the number of the annular shapes of the gate electrode is not limited to one. Two examples of such structure are shown in FIGS. 13(a) and 13(b). Also, it should be noted that a second gate electrode, such as shown in FIG. 7, can be used in an MOSFET embodying the invention. Further, the gate electrode structures shown in FIGS. 9, 10 and 11 on Si MOSFETs can also be applied to heterojunction transistors.

As for the material for forming the heterojunction, an Si-Ge system may be used as well. It is a matter of course, in addition, that the element ratio between Al and Ga is not limited to 3:7.

According to the present invention, as described above, the current-voltage characteristic as shown in FIG. 3 can be obtained, and thus it can be applied to an amplifier, a memory, etc.

The above-described embodiments have all been directed to heterojunction field effect transistors. In particular, these embodiments take advantage of the fact that the electrons will flow in two-dimensional paths at the heterojunction between the layers 9 and 7. As noted previously, the application of an electrostatic field from a branched gate electrode 1 in conjunction with one or more separate control electrodes is preferable to the previously developed arrangements which require paths which are vertically displaced to one another.

However, the invention is not limited only to heterojunction devices. For example, the present invention is also particularly applicable to MOSFETs. Such MOSFETs also conduct carriers between a source and drain two-dimensionally at the interface of the substrate and the gate insulating film under the gate electrode. Therefore, the same principles discussed above for controlling the carrier flow in branching paths for heterojunction devices can also be carried out for MOSFET structures.

Figures 8A, 8B:
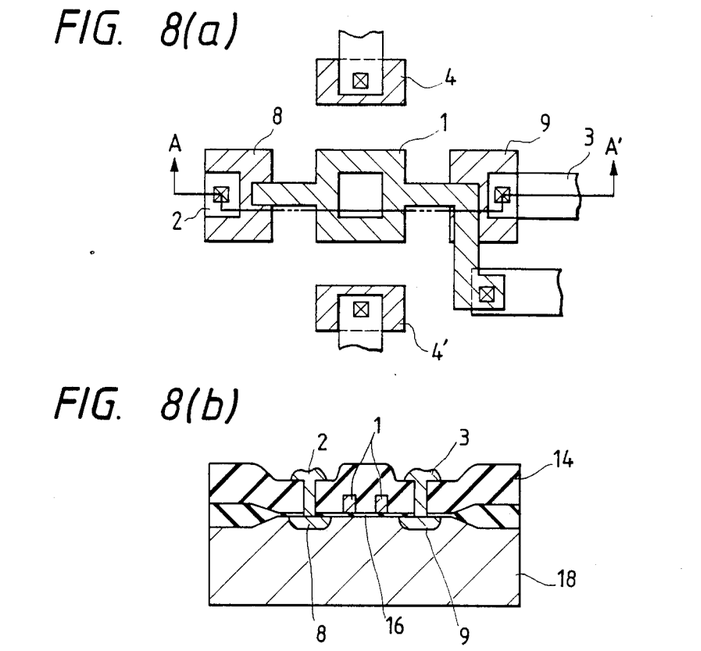
FIGS. 8(a), 8(b), 9(a), 9(b), 10(a) and 10(b) illustrate MOSFET embodiments of the present invention.

FIGS. 8(a) and 8(b) provide an illustration of one MOSFET embodiment in accordance with the present invention wherein FIG. 8(b) is a cross-sectional view of A—A' of FIG. 8(a). In this figure, identical numerals identify identical elements to FIGS. 1(a) and 1(b). Thus, it can be seen that this arrangement has the same branching gate structure 1 and control electrode structure 4 and 4' used in FIG. 1. However, in the embodiment of FIGS. 8(a) and 8(b) a thin gate oxide film 16 is used for forming the MOS structure. FIG. 8(b) also illustrates the insulator 14 and substrate 18 in which the source and drain regions are formed. The device of FIGS. 8(a) and 8(b) will be operated with application of potential to the gate 1 and the control electrodes 4 and 4', similar to the arrangement described for FIGS. 1(a) and 1(b), and will produce modulated effects similar to those shown in FIGS. 3 and 4.

Figures 9A, 9B:
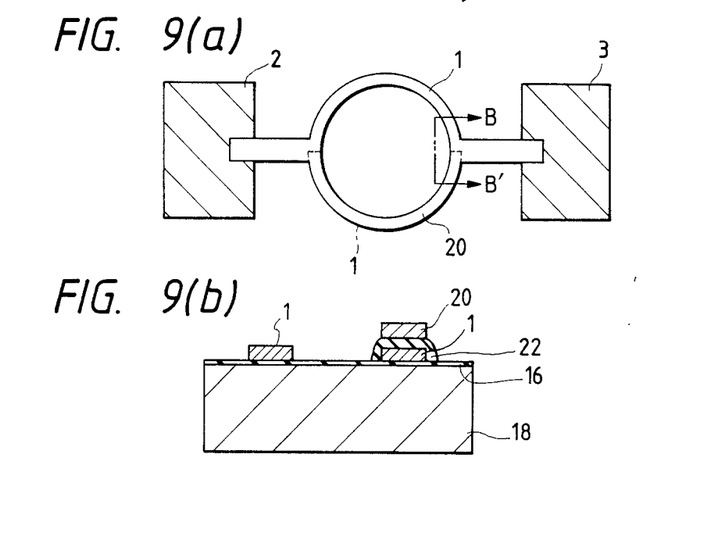

FIGS. 9(a) and 9(b) show another embodiment of a MOSFET structure of the present invention (wherein FIG. 9(b) is a cross-sectional view of B—B' of FIG. 9(a)). As seen in this arrangement, a floating gate 20 is formed over one of the branches of the gate electrode 1 (separated from this branch by an insulator 22). By virtue of this floating gate electrode 20, the branch of the conduction path in the substrate thereunder will be subjected to a different electrostatic field than the branch of the conduction path in the substrate which is not under the floating electrode 20. Therefore, the desired phase difference between the two carrier conduction paths can be obtained in this embodiment without the need for separate control electrodes such as 4 and 4'.

Figure 10A:
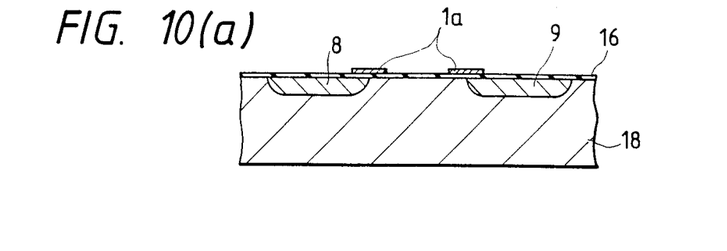
Figure 10B:
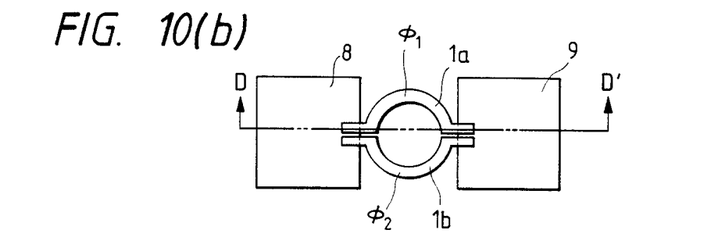

FIGS. 10(a) and 10(b) show another MOSFET embodiment in accordance with the present invention (wherein FIG. 10(a) is a cross-section along lines D—D' of FIG. 10(b)). In this embodiment, the gate electrode is split into two separate electrodes 1a and 1b for coupling the source and drain regions 8 and 9. By virtue of applying different potentials $\phi_1$ and $\phi_2$ to the gate electrodes 1a and 1b, the desired phase difference can be induced in the respective conduction paths under the gate electrodes 1a and 1b without the need for separate control electrodes 4 and 4'.

Figure 11:
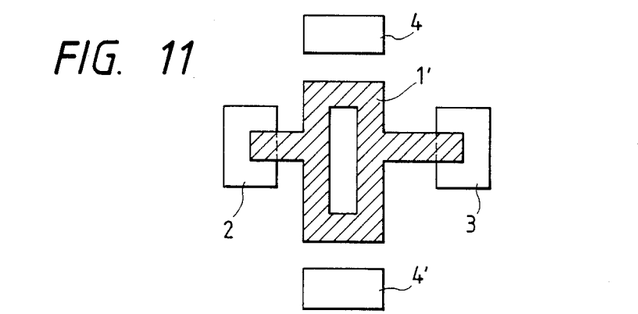
Figure 12:
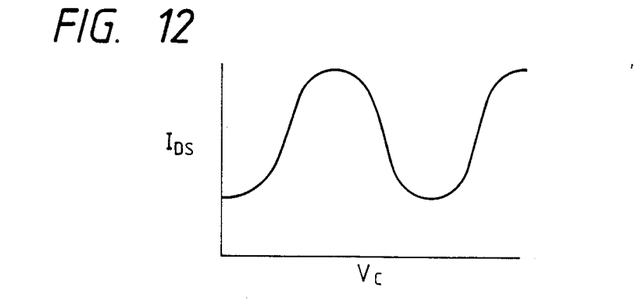
FIG. 12 is a waveform diagram showing the effect on source-drain current which can be achieved using the gate electrode structure of FIG. 11.

The above illustrations have all been directed to symmetrical branches for the gate electrode 1. As seen in FIGS. 3 and 4, this can be used to produce maximum electric conductivity and maximum $I_{DS}$ when the potential applied to control electrode 4' is zero volts. However, it is possible to modify this structure, if desired, by forming the gate electrode structure 1', as shown in FIG. 11, to have asymmetric branches (i.e., branches of different lengths). In such a case, the points of maximum conductivity and maximum $I_{DS}$ will be shifted, as shown in FIG. 12. Thus, if desired, a zero voltage level at the control electrode 4' can result in a minimum $I_{DS}$, as shown in FIG. 12. Alternatively, adjustment of the respective branch lengths can produce different levels of $I_{DS}$ between minimum and maximum levels for a zero voltage level at control electrode 4'.

As described above, the present invention enables the periodic modulation of electric conductivity by the control electrode provided separately from the gate electrode, and also the easy electric control of the phase of carriers, thus enabling the realization of a semiconductor active element having new functions at a very low power.

It is to be understood that the above-described arrangements are simply illustrative of the application of the principles of this invention. Numerous other arrangements may be readily devised by those skilled in the art which embody the principles of the invention and fall within its spirit and scope.

What is claimed is:

1. A semiconductor transistor comprising:
    a first semiconductor layer having a source region and a drain region formed therein separated from one another by a portion of said first semiconductor layer;
    a gate electrode formed over said portion of said first semiconductor layer between said source and drain regions, wherein said gate electrode splits to form first and second branches at a first location adjacent to said source region and wherein said first and second branches rejoin one another at a second location adjacent to said drain region so that application of a potential to said gate electrode will produce first and second two-dimensional carrier conduction paths adjacent to a surface of said portion of said first semiconductor layer under said first and second branches between said source and drain regions; and
    means for modifying the phase of carriers passing through said first conduction path between said source and drain regions relative to the phase of carriers passing through said second conduction path between said source and drain regions to produce a phase difference for carriers received at said drain region through said first and second conduction paths,
    wherein said phase modifying means comprises a floating gate electrode formed over said first branch of said gate electrode.

2. A semiconductor transistor according to claim 1, wherein said phase modifying means comprises at least one control electrode formed over said substrate at a location separate from said gate electrode for producing a depletion layer to modify the phase of carriers passing through said first conduction path relative to the phase of carriers passing through said second conduction path.

3. A semiconductor transistor according to claim 1, wherein said first semiconductor layer is formed of a semiconductor material of a first type, and wherein said transistor further comprises a second semiconductor layer formed of a semiconductor material of a second type between said first semiconductor layer and said gate electrode to form a heterojunction at the interface of said first and second semiconductor layers between said source and drain regions, wherein said first and second two-dimensional carrier conduction paths are formed adjacent to said heterojunction.

4. A semiconductor transistor according to claim 2, wherein said first semiconductor layer is formed of a semiconductor material of a first type, and wherein said transistor further comprises a second semiconductor layer formed of a semiconductor material of a second type between said first semiconductor layer and said gate electrode to form a heterojunction at the interface of said first and second semiconductor layers between said source and drain regions, wherein said first and second two-dimensional carrier conduction paths are formed adjacent to said heterojunction.

5. A semiconductor transistor according to claim 1, further comprising a gate insulating film formed between said first semiconductor layer and said gate electrode so that said first and second two-dimensional carrier conduction paths are formed adjacent to the interface of said first semiconductor layer and said gate insulating film.

6. A semiconductor transistor according to claim 2, further comprising a gate insulating film formed between said first semiconductor layer and said gate electrode so that said first and second two-dimensional carrier conduction paths are formed adjacent to the interface of said first semiconductor layer and said gate insulating film.

7. A semiconductor transistor according to claim 1, wherein said first and second branches have different lengths from one another.

8. A semiconductor transistor comprising:
a first semiconductor layer having a source region and a drain region formed therein separated from one another by a portion of said first semiconductor layer;
a first gate electrode formed over a first portion of said first semiconductor layer between said source and drain regions;
a second gate electrode formed over a second portion of said first semiconductor layer between said source and drain regions; and
means for applying different potentials to said first and second gate electrodes to produce first and second two-dimensional carrier conduction paths under said first and second gate electrodes, respectively, so that the phase of carriers passing from said source to said drain through said first conduction path will be different than the phase of carriers passing from said source to said drain through said second conduction path to produce a phase difference for carriers received at said drain region.

9. A semiconductor transistor according to claim 8, further comprising a gate insulating film formed between said first semiconductor layer and said first and second gate electrodes so that said first and second twodimensional carrier conduction paths are respectively formed adjacent to the interface of said first semiconductor layer and gate insulating film under said first and second gate electrodes.

10. A semiconductor transistor according to claim 8, wherein said first semiconductor layer is formed of a semiconductor material of a first type, and wherein said transistor further comprises a second semiconductor layer formed of a semiconductor material of a second type between said first semiconductor layer and said first and second gate electrodes to form a heterojunction at the interface of said first and second semiconductor layers between said source and drain regions, wherein said first and second two-dimensional carrier conduction paths are formed adjacent to said heterojunction.

11. A semiconductor transistor according to claim 7, further comprising a gate insulating film formed between said first semiconductor layer and said gate electrode so that said first and second two-dimensional carrier conduction paths are formed adjacent to the interface of said first semiconductor layer and said gate insulating film.

12. A semiconductor transistor according to claim 4, wherein said first and second branches have different lengths from one another.

13. A semiconductor transistor according to claim 7, wherein said first semiconductor layer is formed of a semiconductor material of a first type, and wherein said transistor further comprises a second semiconductor layer formed of a semiconductor material of a second type between said first semiconductor layer and said gate electrode to form a heterojunction and the interface of said first and second semiconductor layers between said source and drain regions, wherein said first and second two-dimensional carrier conduction paths are formed adjacent to said heterojunction.

14. A semiconductor transistor according to claim 4, wherein said first and second branches have different lengths from one another.

15. A semiconductor transistor comprising:
a first semiconductor layer having a source region and a drain region formed therein separated from one another by a portion of said first semiconductor layer;
a first gate electrode formed over said portion of said first semiconductor layer between said source and drain regions, wherein said first gate electrode splits to form first and second branches at a first location adjacent to said source region and wherein said first and second branches rejoin one another at a second location adjacent to said drain region so that application of a potential to said first gate electrode will produce first and second two-dimensional carrier conduction paths adjacent to a surface of said portion of said first semiconductor layer under said first and second branches between said source and drain regions;
means for modifying the phase of carriers passing through said first conduction path between said source and drain regions relative to the phase of carriers passing through said second conduction path between said source and drain regions to produce a phase difference for carriers received at said drain region through said first and second conduction paths; and a second gate electrode formed over said first gate electrode so as to control inversion of a central part of said first semiconductor layer surrounded by the first gate electrode.

16. A semiconductor transistor according to claim 15, wherein said phase modifying means comprises at least one control electrode formed over said substrate at a location separate from said first gate electrode for producing a depletion layer to modify the phase of carriers passing through said first conduction path relative to the phase of carriers passing through said second conduction path.

17. A semiconductor transistor according to claim 16, wherein said phase modifying means comprises at least one control electrode formed over said substrate at a location separate from said gate electrode for producing a depletion layer to modify the phase of carriers passing through said first conduction path relative to the phase of carriers passing through said second conduction path.

18. A semiconductor transistor according to claim 15, wherein said phase modifying means comprises a floating gate electrode formed over said first branch of said gate electrode.

19. A semiconductor transistor according to claim 15, wherein said first semiconductor layer is formed of a semiconductor material of a first type, and wherein said transistor further comprises a second semiconductor layer formed of a semiconductor material of a second type between said first semiconductor layer and said first gate electrode to form a heterojunction at the interface of said first and second semiconductor layers between said source and drain regions, wherein said first and second two-dimensional carrier conduction paths are formed adjacent to said heterojunction.

20. A semiconductor transistor according to claim 16, wherein said first semiconductor layer is formed of a semiconductor material of a first type, and wherein said transistor further comprises a second semiconductor layer formed of a semiconductor material of a second type between said first semiconductor layer and said first gate electrode to form a heterojunction at the interface of said first and second semiconductor layers between said source and drain regions, wherein said first and second two-dimensional carrier conduction paths are formed adjacent to said heterojunction.

21. A semiconductor transistor according to claim 15, further comprising a gate insulating film formed between said first semiconductor layer and said gate electrode so that said first and second two-dimensional carrier conduction paths are formed adjacent to the interface of said first semiconductor layer and said gate insulating film.

22. A semiconductor transistor according to claim 16, further comprising a gate insulating film formed between said first semiconductor layer and said first gate electrode to that said first and second two-dimensional carrier conduction paths are formed adjacent to the interface of said first semiconductor layer and said gate insulating film.

23. A semiconductor transistor according to claim 16, wherein said phase modifying means comprises a floating gate electrode formed over said first branch of said gate electrode.

24. A semiconductor transistor according to claim 15, wherein said first and second branches have different lengths from one another.

25. A semiconductor transistor according to claim 16, wherein said first and second branches have different lengths from one another.

26. A semiconductor transistor according to claim 25, wherein said phase modifying means comprises a floating gate electrode formed over said first branch of said gate electrode.

27. A semiconductor transistor according to claim 25, wherein said first semiconductor layer is formed of a semiconductor material of a first type, and wherein said transistor further comprises a second semiconductor layer formed of a semiconductor material of a second type between said first semiconductor layer and said gate electrode to form a heterojunction at the interface of said first and second semiconductor layers between said source and drain regions, wherein said first and second two-dimensional carrier conduction paths are formed adjacent to said heterojunction.

28. A semiconductor transistor according to claim 25, further comprising a gate insulating film formed between said first semiconductor layer and said gate electrode so that said first and second two-dimensional carrier conduction paths are formed adjacent to the interface of said first semiconductor layer and said gate insulating film.

29. A semiconductor transistor according to claim 15, wherein said second gate electrode has an annular shape with first and second branches corresponding to the shape of said first gate electrode.

* * * * *